US011567130B1

(12) United States Patent
Trock et al.

(10) Patent No.: US 11,567,130 B1
(45) Date of Patent: Jan. 31, 2023

(54) INPUT/OUTPUT VOLTAGE TESTING WITH BOUNDARY SCAN BYPASS

(71) Applicant: Amazon Technologies, Inc., Seattle, WA (US)

(72) Inventors: Dan Trock, Katzrin (IL); Alon Postavski, Katzir (IL); Etai Wagner, Haifa (IL); Victor David Romanov, Pardes Hanna-Karkur (IL)

(73) Assignee: Amazon Technologies, Inc., Seattle, WA (US)

( * ) Notice: Subject to any disclaimer, the term of this patent is extended or adjusted under 35 U.S.C. 154(b) by 60 days.

(21) Appl. No.: 17/247,217

(22) Filed: Dec. 3, 2020

(51) Int. Cl.
*G01R 31/3177* (2006.01)
*G01R 31/317* (2006.01)

(52) U.S. Cl.
CPC ... *G01R 31/3177* (2013.01); *G01R 31/31712* (2013.01); *G01R 31/31724* (2013.01)

(58) Field of Classification Search
None
See application file for complete search history.

(56) References Cited

U.S. PATENT DOCUMENTS

| 7,598,726 B1* | 10/2009 | Tabatabaei ..... G01R 31/318508 324/756.07 |
| 2008/0209284 A1* | 8/2008 | Louie ..................... G11C 29/48 714/718 |
| 2013/0271167 A1* | 10/2013 | Thiruvengadam .......................... G01R 31/3008 324/750.02 |

FOREIGN PATENT DOCUMENTS

CN 110118921 A * 8/2019 ......... G01R 31/2851

* cited by examiner

*Primary Examiner* — Guerrier Merant
(74) *Attorney, Agent, or Firm* — Weaver Austin Villeneuve & Sampson LLP

(57) ABSTRACT

An integrated circuit device may include core circuitry, and a set of external interface buffer circuits coupled to the core circuitry. To improve test time and accuracy, as well as to simplify test procedures during voltage testing of the set of external interface buffer circuits, the integrated circuit device may include a test circuit and a combinational logic circuit coupled to the set of external interface buffer circuits. The combinational logic circuit is configured to combine a logic level of each of the external interface buffer circuits into a test signal, and the test circuit is configured to execute a voltage test on the set of external interface buffer circuits based on a logic level of the test signal.

21 Claims, 9 Drawing Sheets

INPUT/OUTPUT VOLTAGE TESTING WITH BOUNDARY SCAN BYPASS

BACKGROUND

Semiconductor chips typically have input/output (I/O) pins that go through an electrical characterization process in which operating voltage margins are determined and published as the chip's electrical specification. During mass production, screening tests are applied to ensure compliance with the chip's specification. One technique to test a chip's I/O pins is to use the on-chip boundary scan infrastructure. The main objective of boundary scan is to facilitate an interconnect test between semiconductor chips mounted on a printed circuit board after its manufacturing and assembly. However, automatic test equipment (ATE) can also use that boundary scan infrastructure to test and verify the electrical characteristics of the I/O pins.

BRIEF DESCRIPTION OF THE DRAWINGS

Various embodiments in accordance with the present disclosure will be described with reference to the drawings, in which.

DETAILED DESCRIPTION

Figure 1A:
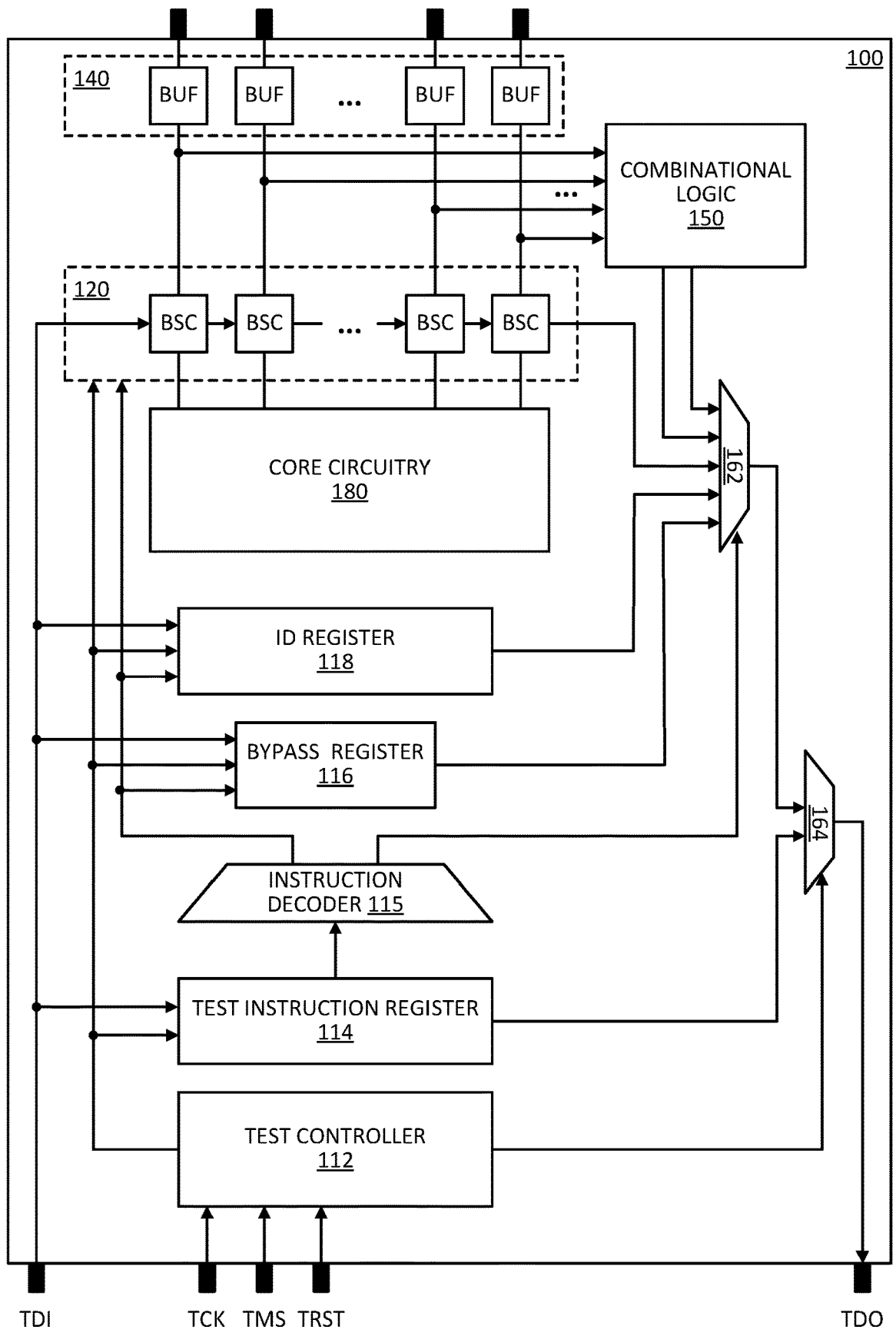
FIG. 1A illustrates an example of an integrated circuit device.

One type of electrical characteristic tests that can be performed on the I/O pins of a semiconductor chip is a set of voltage level tests to determine the voltage input high ($V_{IH}$), voltage input low ($V_{IL}$), voltage output high ($V_{OH}$), and voltage output low ($V_{OL}$) of the chip. $V_{IH}$ refers to the minimum input voltage that the chip recognizes an input signal as a logic one. $V_{IL}$ refers to the maximum input voltage that the chip recognizes an input signal is a logic zero. $V_{OH}$ refers to the minimum output voltage that the chip provides when an output signal is a logic one. $V_{OL}$ refers to the maximum output voltage that the chip provides when an output signal is a logic zero. In addition to testing for these voltages, mid-voltage range can also be tested to ensure the I/O demonstrates healthy hysteresis and is immune to noise. When switching from a logic zero to a logic one, the input voltage will need to be sufficiently high enough to switch the logic state; similarly, when switching from a logic one to a logic zero, the input voltage will need to be sufficiently low enough to switch the logic state. The difference between these two input voltage points (which can be at least 100 mV) is referred to as the hysteresis. A large hysteresis provides good noise immunity, because this indicates the I/O is reluctant to change state on small voltage swings.

To characterize $V_{IH}$ for a chip using boundary scan, a low input voltage (e.g., $V_{SS}$, GND, etc.) is initially applied to the I/O pins of the chip. The input voltage is incremented in steps, and after each voltage increment, the logic level registered internally on each I/O pin is shifted out on the boundary scan chain to check if the I/O pins have registered a logic one. The input voltage at which all I/O pins under test have registered a logic one can be specified as the $V_{IH}$ for the set of I/O pins. The input voltage at which at least one of the I/O pins under test has registered a logic one can be an upper bound of the input voltage hysteresis for the set of I/O pins. Similarly, to characterize $V_{IL}$, using boundary scan, a high input voltage (e.g., $V_{DD}$, etc.) is initially applied to the I/O pins of the chip. The input voltage is decremented in steps, and after each voltage decrement, the logic level registered internally on each I/O pin is shifted out on the boundary scan chain to check if the I/O pins have registered a logic zero. The input voltage at which all I/O pins under test have registered a logic zero can be specified as the $V_{IL}$, for the set of I/O pins. The input voltage at which at least one of the I/O pins under test has registered a logic zero can be a lower bound of the input voltage hysteresis for the set of I/O pins.

To characterize $V_{OH}$ for a chip using boundary scan, a test pattern of all logic ones is shifted along the boundary scan chain until all I/O pins under test are driven by a logic one. The outputs of the I/O pins are provided with an output load, and the output voltage on each I/O pin is measured as $V_{OH}$. Similarly, to characterize $V_{OL}$ for a chip using boundary scan, a test pattern of all logic zeros is shifted along the boundary scan chain until all I/O pins under test are driven by a logic zero. The outputs of the I/O pins are provided with an output load, and the output voltage on each I/O pin is measured as $V_{OL}$. It should be understood that theses voltage characterization tests are performed across the operating conditions of the chip (e.g., across the acceptable supply voltage ranges, operating temperature range, etc.).

During mass production after the electrical characteristics of a chip design have been obtained and published as the chip's specification, the mass-produced chip can be screened against the chip's specification for quality assurance purposes. The screening tests can be performed in a similar manner using boundary scan. For a $V_{IH}$ screening test, a voltage level corresponding to $V_{IH}$ is applied to all I/O pins under test, and the internally detected logic value is stored in the boundary scan chain. The logic values can then be shifted out of the boundary scan chain to verify that all I/O pins under test have registered a logic one value. For a $V_{IL}$, screening test, a voltage level corresponding to $V_{IL}$, is applied to all I/O pins under test, and the internally detected logic value is stored in the boundary scan chain. The logic values can then be shifted out of the boundary scan chain to verify that all I/O pins under test have registered a logic zero value. For $V_{OH}$ screening test, a test pattern of all logic ones is shifted into the boundary scan chain until all I/O pins under test are internally driven with a logic one, and the output voltage of each of the I/O pins is measured to verify that that output voltage level is at a voltage level equal to or higher than $V_{OH}$. For $V_{OL}$ screening test, a test pattern of all logic zeros is shifted into the boundary scan chain until all I/O pins under test are internally driven with a logic zero, and the output voltage of each of the I/O pins is measured to verify that that output voltage is at a voltage level less than or equal to $V_{OL}$. The voltage screening tests can be performed at the minimum and maximum operating conditions (e.g., minimum supply voltage, maximum supply voltage, minimum temperature, maximum temperature, etc.) to ensure the chip meets its specifications over the valid range of operating conditions. Chips that do not pass the screening test can be considered defective and are not sold to customers.

In each of the voltage tests described above, the logic values registered on the boundary scan chain has to be shifted out of the chip (e.g., for $V_{IH}/V_{IL}$ testing), or a test pattern has to be shifted into the chip along the boundary scan chain (e.g., for $V_{OH}/V_{OL}$ testing). Furthermore, each test has to be repeated multiple times, for example, to increment or decrement the input voltage for voltage characterization, and/or performing the test across the operating conditions of the chip. Each iteration of the test would require its own sequence of loading or unloading the boundary scan chain. For a chip with thousands of I/O pins, each iteration of a test may require thousands of test clock cycles to perform the shifting operation. Multiplying the number of test clock cycles per test, and then by the number of iterations (e.g., number of voltage increment/decrement steps, operating conditions, etc.), and further by the number of chips under test can result in a significant amount of testing time.

Performing these voltage tests using boundary scan can also lead to results having less precision than the capability of the test equipment. When a chip is tested on automated test equipment (ATE), the chip is placed in a socket connected to a test card. The test card provides a connection between each pin of the chip and the ATE. Each pin of the chip can interact with the ATE using one of the following functional modules: a driver to drive a digital signal into the pin of the chip, a receiver to receive a digital signal from the pin of the chip for comparison with an expected digital waveform, or a pin parametric measurement unit (PPMU) that provides a finer precision circuit typically used for characterization of analog devices.

The PPMU can provide voltage precision down to, for example, 1 mV resolution, whereas the driver/receiver of the ATE can be limited to a resolution of, for example, 5 mV. Although the PPMU can provide more accurate measurements and characterization results, the PPMU functional module may require the system to be in a quiescent state in which the ATE drivers are kept disabled. However, the ATE drivers are used to drive control signals such as a test clock into the chip to load and unload the boundary scan chain. Hence, despite the better voltage precision of the PPMU, the PPMU may be incompatible with the shifting operation used with boundary scan chain testing. Accordingly, a mechanism to bypass the shifting operation of the boundary scan chain can allow the PPMU to be used for voltage characterization to achieve a finer precision.

The techniques disclosed herein can reduce the testing time required for performing the various voltage characterization tests and to improve the voltage precision by allowing PPMU to be used for testing. The techniques disclosed herein can also be used to reduce screening test time when a chip is in mass production. The testing procedure for voltage characterization can also be simplified, because the techniques disclosed herein can eliminate the need to prepare a boundary scan test pattern for such voltage tests, which can be unique for different chips. During a $V_{IH}/V_{IL}$ test, instead of shifting internally received logic values out of the boundary scan chain, the logic level at the outputs of the receivers of the I/O pins can be logically combined into a test signal, and the $V_{IH}/V_{IL}$ can be determined when the logic level at the test signal transitions. By combining the internal logic levels of the I/O pins into a test signal, the I/O pins can be tested collectively without having to shift logic values along the boundary scan chain from one I/O pin to the next until the entire boundary scan chain is unloaded. This can eliminate the thousands of test clock cycles that would otherwise be required for each iteration of the test to shift the logic values out of the boundary scan chain. During a $V_{OH}/V_{OL}$ test, instead of shifting a test pattern of logic values along the entire boundary scan chain, all I/O pins under test can be concurrently set to be driven by a logic one or a logic zero. Again, this can eliminate the thousands of test clock cycles that would otherwise be required for each iteration of the test to load the logic values into the boundary scan chain. By eliminating the shifting operation of the boundary scan chain, test equipment with better precisions such as PPMU can also be used because the ATE drivers can be disabled once the particular test mode has been set.

In the following description, various embodiments will be described. For purposes of explanation, specific configurations and details are set forth in order to provide a thorough understanding of the embodiments. However, it will also be apparent to one skilled in the art that the embodiments may be practiced without the specific details. Furthermore, well-known features may be omitted or simplified in order not to obscure the embodiments being described.

FIG. 1A illustrates a simplified block diagram of an example of an integrated circuit device 100, which may also be referred to as a chip. The integrated circuit device 100 may include core circuitry 180 that performs one or more functions of the integrated circuit device 100. Core circuitry 180 may include, for example, computing circuitry to implement a processor chip, storage circuitry to implement a memory chip, network interface circuitry to implement a network interface chip, graphics processing circuitry to implement a graphic processor chip, and/or other types of application specific integrated circuits (ASIC). In some implementations, core circuitry 180 may include programmable circuitry to implement a programmable logic chip such as a field programmable gate array (FGA). Core circuitry 180 may also integrate various types of circuits to implement a system-on-a-chip (SOC) device.

To communicate with external components, integrated circuit device 100 includes one or more sets of external interface pins (shown as black rectangles in FIG. 1A). Depending on the packaging of integrated circuit device 100, the external interface pins may also be referred to as pads, leads, balls, etc. An external interface pin can implement an input signal, an output signal, or an input/output signal. Each external interface pin can be connected to an external interface buffer circuit 140 that couples the external interface pin to core circuitry 180. Depending on the type of signal implemented by the external interface pin, the corresponding external interface buffer circuit may include a driver for an output signal, a receiver for an input signal, or a combination of both a driver and a received for an input/output signal. A driver may also be referred to as an output buffer, and a receiver may also be referred to as an input buffer.

Integrated circuit device 100 may also include test circuitry configured to execute various tests on the integrated circuit device 100. The test circuitry may include a test controller 112 and/or one or more test registers such as a test instruction register 114. Test controller 112 may receive one or more external inputs that are used to control test controller 112 to program the test registers. For example, test controller 112 can program test instruction register 114 with a test instruction, and an instruction decoder 115 can decode the test instruction stored in test instruction register 114 to execute a test on integrated circuit device 100 such as any of the voltage tests described herein.

In some implementations, the test circuitry can be compliant with the Institute of Electrical and Electronics Engineers (IEEE) 1149.1 Joint Test Action Group (JTAG) standard (hereinafter "JTAG standard"). In such implementations, test instruction register can be a JTAG instruction register that is implemented for boundary scan test, and test controller 112 may include a test access port (TAP) controller that responds to a set of input signals including a test clock signal (TCK), a test mode select signal (TMS), and an optional test reset signal (TRST). These input signals are used to control a state machine implemented in the TAP controller to selectively shift data received on a test data input signal (TDI) into one of the test registers, and to selectively shift out data on a test data output signal (TDO) from one of the test registers.

In addition to test instruction register 114, the test registers may also include a boundary scan register 120, an identification (ID) code register 118 that stores a device ID of integrated circuit device 100, and a bypass register 116 that can be used to connect TDI to TDO while bypassing the boundary scan register 120. In some implementations, bypass register 116 can be implemented as a single-stage shift register. Depending on the test instruction, either the boundary scan chain data, the device ID, or the data received on TDI can be selected by multiplexor 162 for shifting out onto the TDO signal. It should be understood that the test circuitry may include additional test data registers not specifically shown. In addition to shifting data from one of the data registers (e.g., boundary scan register 120, ID code register 118, or bypass register 116, etc.) onto the TDO signal, test controller 112 can also control multiplexor 164 to select the contents of the instruction register 114 to be shifted out onto the TDO signal.

Boundary scan register 120 may include a set of boundary scan cells that are each coupled between an external interface buffer circuit 140 and core circuitry 180. The boundary scan cells are implemented as a series of shift registers to allow a test pattern to be shifted in from TDI such that the test pattern can be observed on the I/O pins, and to allow signals from the I/O pins to be captured and stored in the shift registers for shifting out onto TDO. As discussed above, relying on the shifting operation of the boundary scan chain 120 to perform voltage testing can lead to a significant amount of testing time and may also prevent high precision tester modules such as the PPMU from being used. As such, the techniques disclosed herein provide a mechanism to perform voltage testing without requiring a test pattern to be shifted into the boundary scan chain, and without requiring captured values to be shifted out of the boundary scan chain.

For example, integrated circuit device 100 may include a combinational logic circuit 150 coupled to the set of external interface buffer circuits 140. Combinational logic circuit 150 is configured to combine a logic level of each of the external interface buffer circuits into one or more test signals. For example, combination logic circuit 150 may include a logical OR circuit, and/or a logical AND circuit. The outputs of the input buffers of external interface buffer circuits 140 can be coupled to the inputs of combination logic circuit 150 to generate a first test signal that is derived from logically ORing the logic values driven from the input buffers of external interface buffer circuits 140, and/or a second test signal that is derived from logically ANDing the logic values driven from the input buffers of external interface buffer circuits 140. The generated test signal(s) can be outputted to an output pin (e.g., TDO) such that a logic level transition of the test signal(s) can be detected to determine the $V_{IH}/V_{IL}$ and input voltage hysteresis of integrated circuit device 100.

A logical AND circuit can be used to bypass the shifting operation of the boundary scan chain 120 for $V_{IH}$ testing. During a $V_{IH}$ determination test that is configured to collectively determine a $V_{IH}$ for the set of external interface buffer circuits 140, the outputs of the input buffers of the set of external interface buffer circuits 140 under test is ANDed together to generate a test signal. An input voltage is applied to the set of external interface buffer circuits 140 via their corresponding I/O pins, and the input voltage is swept from a low voltage (e.g., $V_{SS}$, GND, etc.) towards a high voltage (e.g., $V_{DD}$, etc.). In some implementations, if the expected operating margin is known, the testing time can further be reduced by starting the voltage sweep at an intermediate voltage level that is higher than $V_{SS}$ or GND. All I/O pins under test may receive the same input voltage level. The input voltage can be incremented in steps (e.g., 1 mV if the PPMU is used). The generated test signal is monitored, and the input voltage level at which a transition from a logic zero to a logic one is detected at the output of the logical AND circuit is determined as the $V_{IH}$ of the set of external interface buffer circuits 140 under test. This $V_{IH}$ is the minimum input voltage level that is guaranteed to produce a logic one internally for the set of external interface buffer circuits 140 under test.

It is possible that some of the external interface buffer circuits 140 under test may transition from a logic zero to a logic one sooner than others as the input voltage is being incremented. However, the minimum voltage level that can guarantee that an internal logic one for all of the external interface buffer circuits 140 under test would still correspond to the voltage level of the last buffer that transitions. This is so, because a lower input voltage may cause some pins to register internally as a logic one while others may remain at a logic zero.

In some implementations, the logical AND circuit can also be used to test $V_{IH}$ for an individual pin or external interface buffer circuit by applying a walking zero pattern to the I/Os under test. For example, to determine a $V_{IH}$ for an individual external interface buffer circuit in the set of external interface buffer circuits 140 under test, an input voltage applied to the individual external interface buffer circuit is swept from a low voltage to a high voltage, while a high voltage (e.g., VDD) corresponding to a logic one is applied to the other external interface buffer circuits 140 in the set of external interface buffer circuits 140. The input voltage level at which a transition from a logic zero to a logic one is detected at the output of the logical AND circuit can be determined as the $V_{IH}$ of that individual pin or the external interface buffer circuit.

In a similar manner, a logical OR circuit can be used to bypass the shifting operation of the boundary scan chain 120 for $V_{IL}$ testing. During a $V_{IL}$ determination test that is configured to collectively determine a $V_{IL}$ for the set of external interface buffer circuits 140, the outputs of the input buffers of the set of external interface buffer circuits 140 under test is ORed together to generate a test signal. An input voltage is applied to the set of external interface buffer circuits 140 via their corresponding I/O pins, and the input voltage is swept from a high voltage (e.g., VDD, etc.) towards a low voltage (e.g., VSS, GND, etc.). In some implementations, if the expected operating margin is known, the testing time can further be reduced by starting the voltage sweep at an intermediate voltage level that is lower than $V_{DD}$. All I/O pins under test may receive the same input voltage level. The input voltage can be decremented in steps (e.g., 1 mV if the PPMU is used). The generated test signal is monitored, and the input voltage level at which a transition from a logic one to a logic zero is detected at the output of the logical OR circuit is determined as the $V_{IL}$ of the set of external interface buffer circuits 140 under test. This $V_{IL}$ is the maximum input voltage level that is guaranteed to produce a logic zero internally for the set of external interface buffers under test.

It is possible that some of the external interface buffers under test may transition from a logic one to a logic zero sooner than others as the input voltage is being decremented. However, the maximum voltage level that can still guarantee an internal logic zero for all of the external interface buffers under test would still correspond to the voltage level of the last buffer that transitions. This is so, because a higher input voltage may cause some pins to register internally as a logic zero while others may remain at a logic one.

In some implementations, the logical OR circuit can also be used to test $V_{IL}$ for an individual pin or external interface buffer circuit by applying a walking one pattern to the I/Os under test. For example, to determine a $V_{IL}$ for an individual external interface buffer in the set of external interface buffer circuits 140 under test, an input voltage applied to the individual external interface buffer circuit is swept from a high voltage to a low voltage, while a low voltage (e.g., $V_{SS}$, GND, etc.) corresponding to a logic zero is applied to the other external interface buffer circuits 140 in the set of external interface buffer circuits 140. The input voltage level at which a transition from a logic one to a logic zero is detected at the output of the logical OR circuit can be determined as the $V_{IL}$ of that individual pin or the external interface buffer circuit.

The logical AND circuit and the logical OR circuit can also be used for input voltage hysteresis testing. For example, the logical AND circuit can be used to detect a lower bound hysteresis voltage for a $V_{IL}$ hysteresis test. The lower bound hysteresis voltage corresponds to the input voltage at which at least one external interface buffer transitions from a logic one to a logic zero when an input voltage applied to the set of external interface buffer circuits is swept from a high voltage to a low voltage. In a similar manner, the logical OR circuit can be used to detect an upper bound hysteresis voltage for a $V_{IH}$ hysteresis test. The upper bound hysteresis voltage corresponds to the input voltage at which at least one external interface buffer transitions from a logic zero to a logic one when an input voltage applied to the set of external interface buffer circuits is swept from a low voltage to a high voltage. The input voltage hysteresis provides an indication of the noise immunity of the I/O buffers of the integrated circuit device, and can be useful information when interfacing the integrated circuit device with other components in a system.

Referring to FIG. 1A, to set integrated circuit device 100 into the $V_{IH}$ or $V_{IL}$ test mode, new JTAG test instructions can be defined for each of these tests. When a $V_{IH}$ or $V_{IL}$ test instruction is written into test instruction register 114, instruction decoder 115 can decode the instruction, and select the proper test signal generated from combinational logic 150 via multiplexor 162 to output onto the TDO pin. Instruction decoder 115 can also generate a signal indicative of $V_{IH}/V_{IL}$ testing, which can be used to allow continuous monitoring on the TDO signal (the details of which will be described with reference to FIG. 1B). In some implementations, the $V_{IH}/V_{IL}$ tests can also be performed independently from JTAG. For example, a separate test instruction register that is not related to JTAG can be implemented to put integrated circuit device 100 into the $V_{IH}$ or $V_{IL}$, test mode. This test instruction register can be written via one or more input signals (e.g. signals other than TDI). Alternatively or additionally, a separate set of one or more test mode input pins can also be used to set integrated circuit device 100 into the $V_{IH}$ or $V_{IL}$, test mode. Moreover, the test signal(s) generated by combination logic 150 can be outputted to one or more test output pins other than TDO. Alternatively or additionally, the logic level of the test signal(s) can be stored in one or more registers than can be read from integrated circuit device 100.

As for $V_{OH}/V_{OL}$ testing, new JTAG test instructions can also be defined for each of these tests. When a $V_{OH}$ or $V_{OL}$ test instruction is written into test instruction register 114, instruction decoder 115 can decode the test instruction, and configure the boundary scan cells in boundary scan chain 120 to concurrently apply a logic one or logic zero to the set of external interface buffers 140 without having to shift in a test pattern into the boundary scan chain. This can reduce the number of test clock cycles to perform $V_{OH}/V_{OL}$ testing and also simplify the test procedure. For example, a logic one can be applied concurrently to the inputs of respective drivers of external interface buffer circuits 140, and the lowest output voltage measured on the I/O pins can be determined as the $V_{OH}$ for the set of external interface buffer circuits 140. Similarly, a logic zero can be applied concurrently to the inputs of respective drivers of external interface buffer circuits 140, and the highest output voltage measured on the I/O pins can be determined as the $V_{OL}$ for the set of external interface buffer circuits 140. The logic level being applied to the drivers of external interface buffer circuits 140 can be provided by an internal signal set to the proper logic level or from an input pin. For example, a reference clock input pin can be repurposed during $V_{OH}/V_{OL}$ test mode to provide the logic one or logic zero from a tester that is applied to the drivers of external interface buffer circuits 140.

In some implementations, the $V_{OH}/V_{OL}$ tests can also be performed independently from JTAG. For example, a separate test instruction register that is not related to JTAG can be implemented to put integrated circuit device 100 into the $V_{OH}$ or $V_{OL}$ test mode. This test instruction register can be written via one or more input signals (e.g., signals other than TDI). Alternatively or additionally, a separate set of one or more test mode input pins can also be used to set integrated circuit device 100 into the $V_{OH}$ or $V_{OL}$ test mode. When integrated circuit device 100 is put into $V_{OH}/V_{OL}$ test mode, the proper logic level can be driven into the respective drivers of the external interface buffer circuits 140.

Figure 1B:
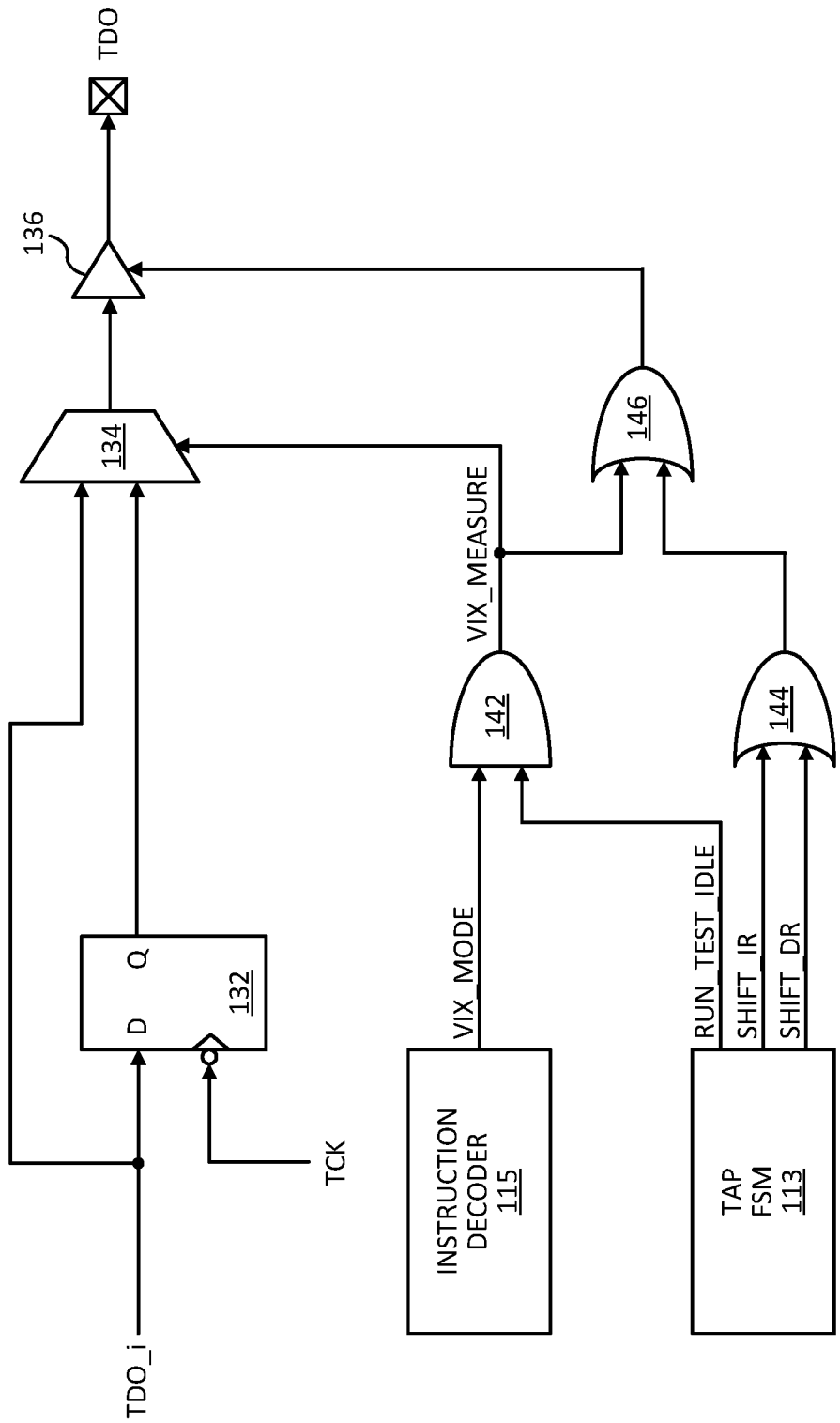
FIG. 1B illustrates an example of a data path for a test signal.

FIG. 1B illustrates block diagram of an example of a datapath for a test signal that allows the test signal to be continuously monitored during a voltage characterization test. FIG. 1B provides additional details of example circuitry that can be implemented between the output of multiplexor 164 and the TDO pin. As described above, in some implementations, the test signal for the voltage characterization tests can be outputted to a test pin such as TDO. However, the TDO pin may be a registered output that is clocked by TCK. As such, the TDO register may prevent continuously monitoring of the test signal because transition of the TDO pin is forced to be synchronized with the TCK clock signal. Furthermore, driving the TCK signal for the TDO register can also result in a loss in precision. As mentioned above, the pin parametric measurement unit (PPMU) for high precision voltage control can be used only when the regular drivers/receivers of the automated test equipment (ATE) are disabled. This cannot be done while the TCK is being driven. As such, the integrated circuit device under test may include circuitry to bypass the TDO register.

Referring to FIG. 1B, additional circuitry can be implemented in integrated circuit device 100 to bypass the TDO register. TDO_i is the internal TDO signal and may correspond to the output of multiplexor 164 in FIG. 1A. In some implementations, to be compliant with the JTAG standard, the TDO pin is a registered output signal when performing boundary scan testing. As such, integrated circuit device 100 may include a register 132 that is used, for example, to register the internal TDO signal (TDO_i) at the falling edge of test clock TCK. To bypass register 132, a multiplexor 134 can be implemented to select between the internal TDO_i signal and the registered version of the TDO_i signal.

The selection signal to multiplexor 134 can be a $V_{IX}$ measure probe signal that is asserted when a $V_{IX}$ test is being performed (e.g., any of $V_{IH}/V_{IL}$ determination or $V_{IH}/V_{IL}$ hysteresis tests). Instruction decoder 115 can generate a $V_{IX}$ mode signal to indicate a $V_{IX}$ test instruction (e.g., any of $V_{IH}/V_{IL}$ determination or $V_{IH}/V_{IL}$ hysteresis test instructions) is written into test instruction register 114 to perform one of input voltage characterization tests. To prevent conflict with regular JTAG operation that outputs values either in test instruction register 114 or in any of the data registers 116, 118, 120, an AND gate 142 is used to generate a logical AND of the $V_{IX}$ mode signal with the run test/idle state of the TAP finite-state-machine (FSM) 113 implemented by test controller 112. This can ensure that the unregistered TDO_i signal is not selected when the TAP FSM 113 is shifting out the contents of the test instruction register 114 or any of the data registers 116, 118, 120 during the shift IR or shift DR states. The unregistered TDO_i signal is selected during $V_{IH}/V_{IL}$ tests when performing continuous voltage measurement. Run-test-idle qualified with the $V_{IH}/V_{IL}$ test command is the steady state of the TAP FSM 113 in which bypassing of register 132 is allowed for continuity of the output signal.

In order to drive the unregistered TDO_i signal to the TDO pin, additional circuitry can be implemented to enable the driver 136 of the TDO pin. During regular JTAG testing, driver 136 is enabled when TAP FSM 113 is in the shift IR or shift DR state to output the contents of test instruction register 114 or any of the data registers 116, 118, 120 onto the TDO pin. Thus, an OR gate 144 can generate a logical OR of the shift IR or shift DR states to enable driver 136. To also enable driver 136 when performing the input voltage characterization tests, an additional OR gate 146 is implemented to generate a logical OR of the $V_{IH}$ measure probe signal and the output of OR gate 144. The output of OR gate 146 can then be used as the enable signal of driver 136 to drive the TDO pin during the shift IR/DR states as well as during input voltage characterization tests.

Figure 2:
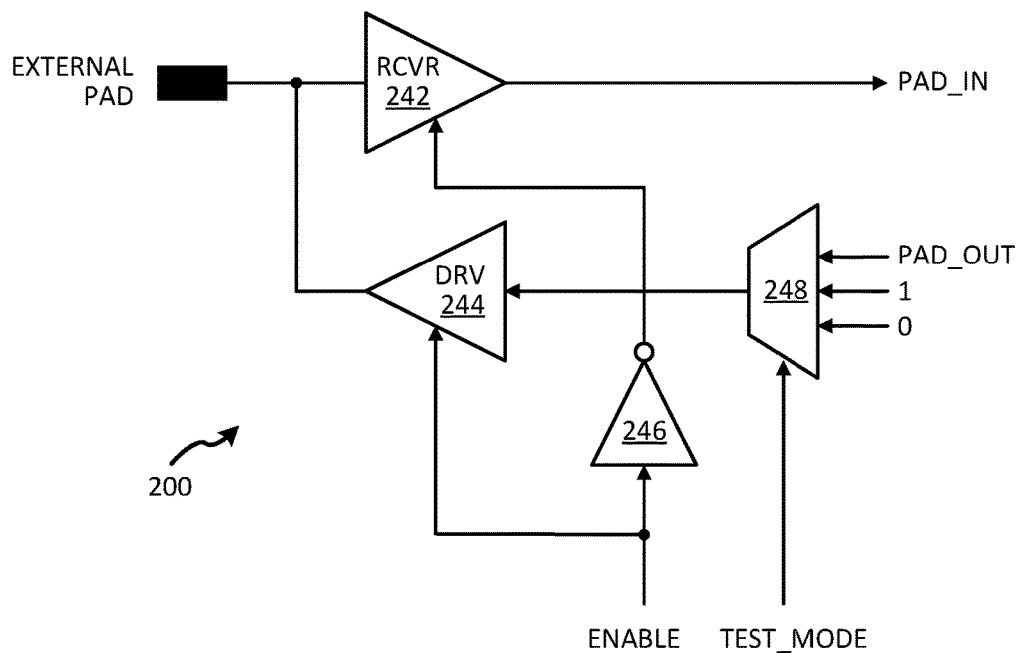
FIG. 2 illustrates an example of an external interface buffer circuit.

FIG. 2 illustrates a block diagram of an example of an external interface buffer circuit 200. External interface buffer circuit 200 can be coupled to an external pad, and may implement an I/O circuit for an I/O signal coupled to the external pad as shown. The I/O circuit implemented in external interface buffer circuit 200 may include a receiver 242 (e.g., an input buffer) and a driver 244 (e.g., output buffer). Because both an input signal and an output signal is coupled to the external pad, only one of receiver 242 or driver 244 can be enabled at a time. As such, the enable signal of driver 244 (e.g., an output enable signal) is inverted by inverter 246 to derive the enable signal of receiver 242. During normal operation, when the external pad is acting as an input signal, a signal driven from outside the chip is buffered by receiver 242 and then driven as the PAD_IN signal to the internal circuitry of the chip. When the external pad is acting as an output signal, a PAD_OUT signal driven from the internal circuitry of the chip is buffered by driver 244 and driven out of the chip on the external interface pad.

To facilitate the $V_{OH}/V_{OL}$ testing according to the techniques disclosed herein, a multiplexor 248 can be implemented to select the input to driver 244 as either the PAD_OUT signal from the internal circuitry, a logic one signal, or a logic zero signal. A TEST_MODE signal can be used to select between the different inputs. The TEST_MODE signal can be, for example, generated from an instruction decoder that decodes a test instruction. When TEST_MODE indicates a $V_{OH}$ test is being performed, multiplexor 248 can select the logic one signal as the input to driver 244. When TEST_MODE indicates a $V_{OL}$ test is being performed, multiplexor 248 can select the logic zero signal as the input to driver 244. For other modes, the PAD_OUT signal can be selected as the input to driver 244. In some implementations, the logic one and logic zero inputs to multiplexor 248 can be combined into a signal that is driven by an input pin (e.g., a reference clock input pin or other input pin).

Although an external interface buffer circuit 200 has been described as implementing an I/O circuit, in some implementations, the external interface buffer circuit can be an input only circuit that is coupled to an input only pin. In such implementations, driver 244, inverter 246, and multiplexor 248 can be omitted from the external interface buffer circuit. In some implementations, the external interface buffer circuit can alternatively be an output only circuit that is coupled to an output only pin. In such implementations, receiver 242 and inverter 248 can be omitted from the external interface buffer circuit.

Figure 3:
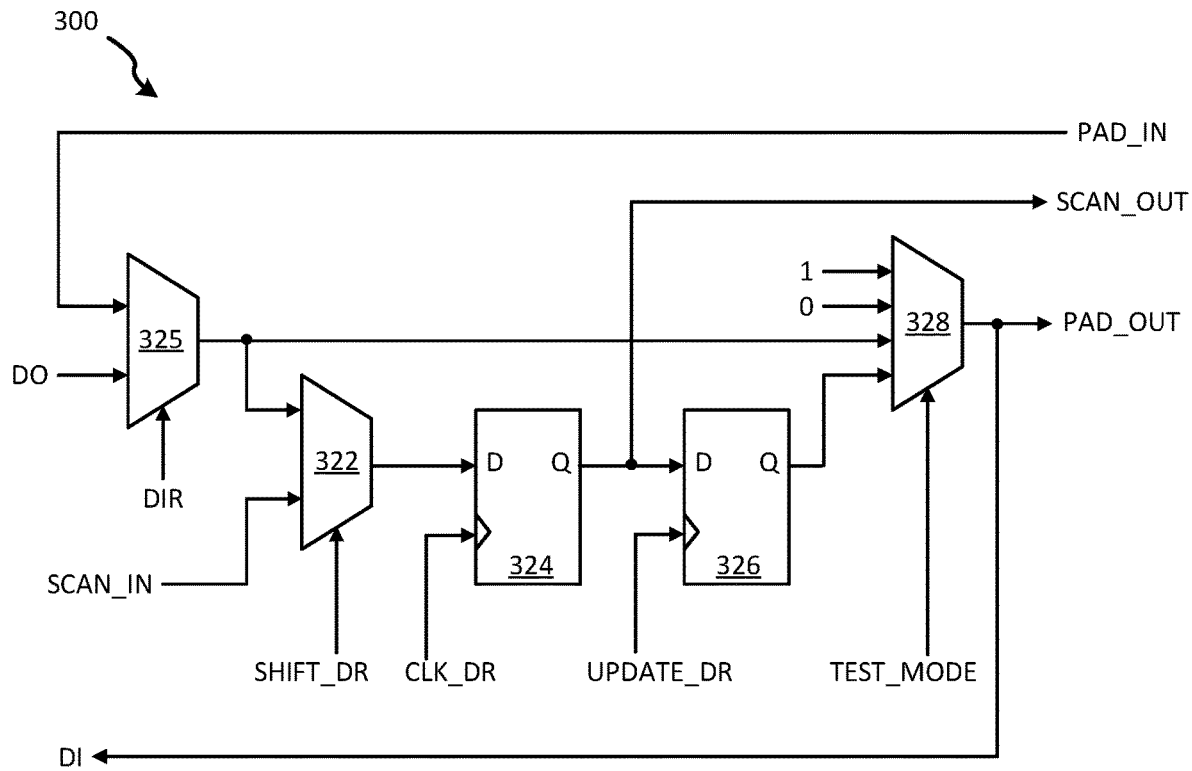
FIG. 3 illustrates an example of a boundary scan cell circuit.

FIG. 3 illustrates a block diagram of an example of a boundary scan cell 300. Boundary scan cell 300 is coupled between an external interface buffer circuit and the core circuitry of the integrated circuit device. Boundary scan circuitry 300 may include a multiplexor 325 to select between a PAD_IN input when the external interface buffer circuit is operating in an input mode and a DO core-to-pad output when the external interface buffer circuit is operating in an output mode based on a DIR signal indicating the input/output mode. A multiplexor 322 selects between the output of multiplexor 325 and SCAN_IN as the input to a shift register 324. The SCAN_IN signal is driven either by the TDI signal (if the boundary scan cell is the first cell in the chain) or by the SCAN_OUT of a previous boundary scan cell in the chain. Multiplexor 322 is controlled by a SHIFT_DR signal, and the shifting operation of 324 is controlled by a CLK_DR signal, both of which are generated by a test controller (e.g., a TAP controller). Boundary scan circuitry 300 may also include an update register 326 that is controlled by an UPDATE DR signal that is also generated by the test controller. The update register 326 can be used to drive a signal from SCAN_IN to PAD_OUT, and thus bypassing the output of multiplexor 325. Multiplexor 328 can be used to select between using the output of multiplexor 325 or SCAN_IN to drive the PAD_OUT signal. During normal operation of the integrated circuit device, multiplexor 328 can select DO as the signal to drive PAD_OUT when the external interface buffer circuit is operating in an output mode or PAD_IN as the signal to drive the DI pad-to-core data input signal when the external interface buffer circuit is operating in an input mode. Thus the boundary scan cell is basically bypassed by multiplexor 328 during normal operation. During boundary scan testing, multiplexor 328 selects the output of update register 326 as the signal to drive PAD_OUT when the external interface buffer circuit is operating in an output mode, or to drive the DI pad-to-core data input signal when the external interface buffer circuit is operating in an input mode. The control signal TEST_MODE that controls multiplexor 328 can be generated, for example, from an instruction decoder.

To facilitate $V_{OH}/V_{OL}$ testing according to the techniques disclosed herein, multiplexor 328 can be modified to select between a logic one or a logic zero to drive PAD_OUT. When TEST_MODE indicates a $V_{OH}$ test is being performed, multiplexor 328 can select the logic one signal. When TEST_MODE indicates a $V_{OL}$ test is being performed, multiplexor 328 can select the logic zero signal. For other test modes, multiplexor 328 can select the output of update register 326. For normal operation, multiplexor 328 can select the output of multiplexor 325. In some implementations, the logic one and logic zero inputs to multiplexor 328 can be combined into a signal that is driven by an input pin (e.g., a reference clock input pin or other input pin).

It should be noted that the logic zero and logic one inputs to multiplexor 328 can be omitted if such is already being provided to multiplexor 248 for the external buffer interface circuit 200 as shown in FIG. 2. Similarly, multiplexor 248 for the external buffer interface circuit 200 shown in FIG. 2 can be omitted if the logic zero and logic one inputs are being provided to multiplexor 328 as shown in FIG. 3. If the external interface buffer circuit is a unidirectional buffer circuit (e.g., receiver/input buffer, or driver/output buffer), then multiplexor 325 can be omitted.

Figure 4:
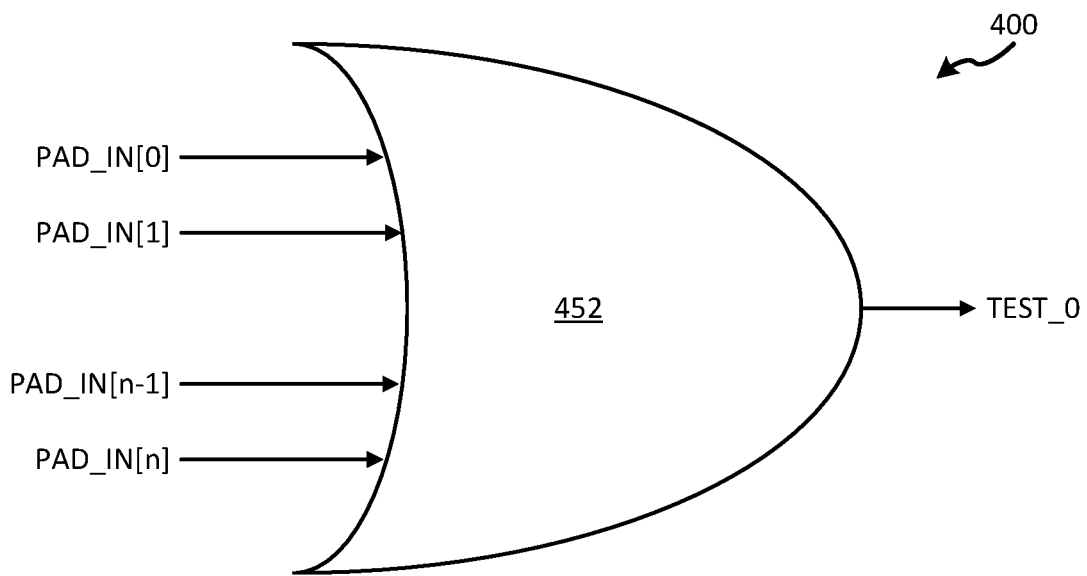
FIG. 4 illustrates an example of a combinational OR logic circuit.

Returning to the discussion of $V_{IH}/V_{IL}$ testing, FIG. 4 illustrates a logical OR circuit 452 that can be implemented in combination logic circuit 150 to facilitate $V_{IL}$ testing. The inputs to logical OR circuit 452 can be driven by the PAD_IN signals of various external interface buffer circuits. As discussed above, the external pads corresponding to the PAD_IN signals can be driven with the same input voltage, for example, from a PPMU of the tester. The input voltage can be swept from a high voltage towards a low voltage. The TEST_0 signal can be monitored (e.g., by outputting TEST_0 to TDO or another output pin), and the input voltage at which TEST_0 transitions from a logic one to a logic zero can be determined as the $V_{IL}$, for the group of PAD_IN signals.

The logical OR circuit 452 can also be used to determine the $V_{IL}$, for an individual PAD_IN signal. For example, to determine $V_{IL}$, for the PAD_IN[0] signal, a low voltage corresponding to a logic zero can be applied to the external pads corresponding to PAD_IN[1] to PAD_IN[n]. An input voltage applied to the external pad corresponding to PAD_IN[0] can be swept from a high voltage towards a low voltage, and input voltage at which TEST_0 transitions from a logic one to a logic zero can be determined as the $V_{IL}$, for the PAD_IN[0] signal. A similar test can be repeated for each individual PAD_IN signal of interest.

Figure 5:
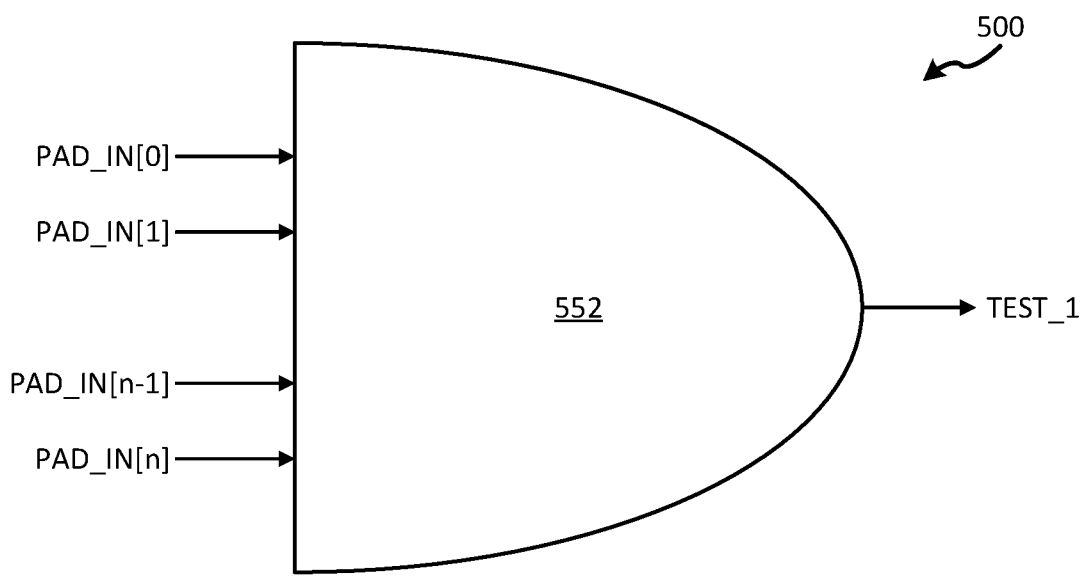
FIG. 5 illustrates another example of a combinational AND logic circuit.

FIG. 5 illustrates a logical AND circuit 552 that can be implemented in combination logic circuit 150 to facilitate $V_{IH}$ testing. The inputs to logical AND circuit 552 can be driven by the PAD_IN signals of various external interface buffer circuits. As discussed above, the external pads corresponding to the PAD_IN signals can be driven with the same input voltage, for example, from a PPMU of the tester. The input voltage can be swept from a low voltage towards a high voltage. The TEST_1 signal can be monitored (e.g., by outputting TEST_1 to TDO or another output pin), and the input voltage at which TEST_1 transitions from a logic zero to a logic one can be determined as the $V_{IH}$ for the group of PAD_IN signals.

The logical AND circuit 552 can also be used to determine the $V_{IH}$ for an individual PAD_IN signal. For example, to determine $V_{IH}$ for the PAD_IN[0] signal, a high voltage corresponding to a logic one can be applied to the external pads corresponding to PAD_IN[1] to PAD_IN[n]. An input voltage applied to the external pad corresponding to PAD_IN[0] can be swept from a low voltage towards a high voltage, and the input voltage at which TEST_1 transitions from a logic zero to a logic one can be determined as the $V_{IH}$ for the PAD_IN[0] signal. A similar test can be repeated for each individual PAD_IN signal of interest.

In some implementations, an integrated circuit device may implement multiple instances of the logical OR circuit 452 and/or multiple instances of the logical AND circuit 552. This can be done, for example, to test pins of different functional groups separately or to test pins with different signaling interfaces. For example, input data signals can be grouped together and tested using one logical OR circuit and/or one logical AND circuit, while input control signals can be grouped together and tested using another logical OR circuit and/or another logical AND circuit. Some integrated circuit devices may implement pins with different signaling interfaces such as TTL (transistor-to-transistor logic), LVTTL (low voltage transistor-to-transistor logic), HSTL (high-speed transceiver logic), etc. Because each of these different types of signaling interfaces have different $V_{IH}/V_{IL}$ levels, pins employing different signaling interfaces should be tested separately. A similar concept can also apply to VOH/VOL testing to test different groups of pins separately. However, the tester monitoring the output voltages of the output pads can separate and group the measurements according to functionality and/or signaling interfaces, and thus it may be unnecessary to make further modifications to the internal test circuitry of the chip for such group separation of $V_{OH}/V_{OL}$ testing.

Figure 6:
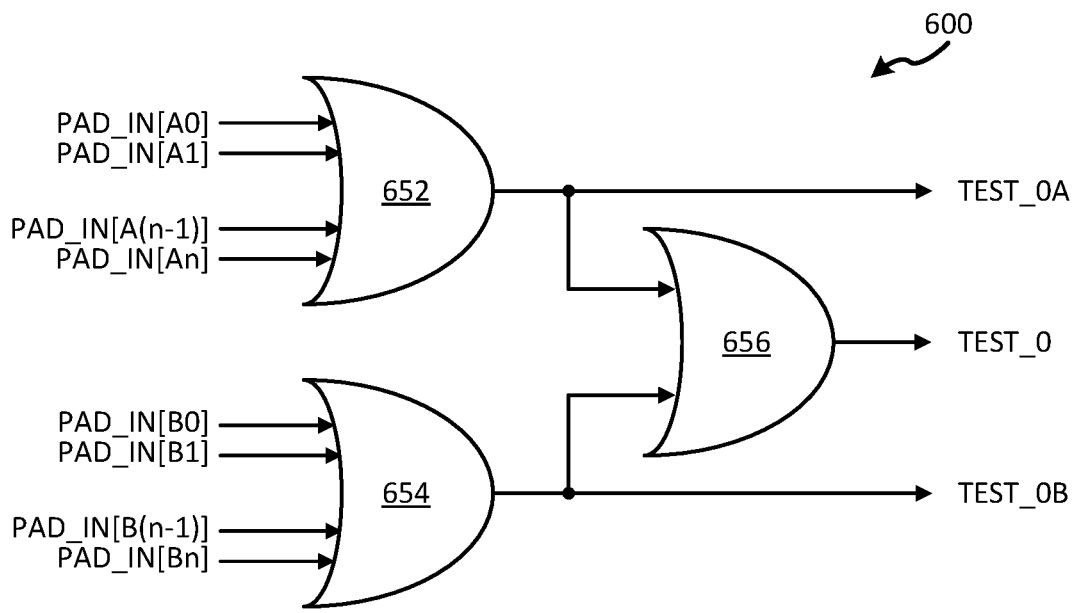
FIG. 6 illustrates an example of a cascaded combinational OR logic circuit.

FIG. 6 illustrates a block diagram of a logical OR tree 600 that can be implemented in combination logic circuit 150 to facilitate $V_{IL}$ testing. Logical OR tree 600 may include multiple logical OR circuits such as logical OR circuits 652 and 654 that are driven by different groups of input signals. The input signals can be grouped, for example, by functionality, signaling interface type, physical location on the chip, and/or other criteria. Each logical OR circuit can generate its own test signal to allow the input signal groups to be tested separately. For example, logical OR circuit 652 can generate a TEST_0A signal, and logical OR circuit 654 can separately generate a TEST_0B signal. To provide testing flexibility, the logical OR circuits can also be cascaded such that the outputs of the logical OR circuits are combined into one test signal. For example, TEST_0A and TEST_0B can be logically combined by OR gate 656 to generate a global TEST_0 signal. Thus, all input signals can be tested collectively by monitoring TEST_0. When separate testing is desired, TEST_0A and TEST_0B can be monitored. The test signals can be outputted to separate output pins or be multiplexed out on a single output pin. Although only two logical OR circuits 652 and 654, and logical OR tree 600 is shown with only two cascading stages, it should be understood that any number of logical OR circuits and any number of cascading stages can be implemented.

Figure 7:
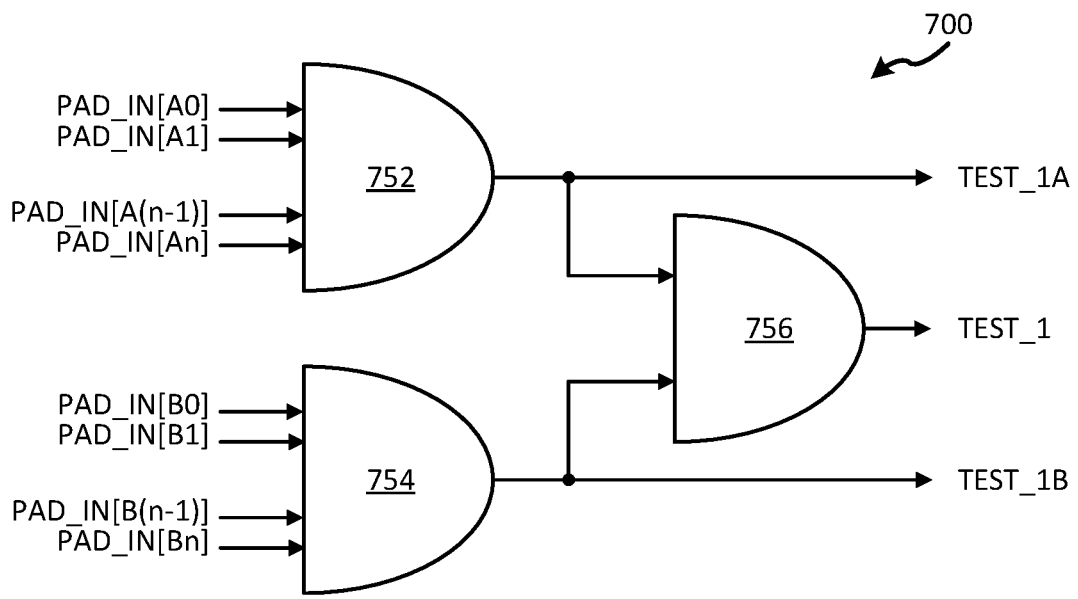
FIG. 7 illustrates another example of a cascaded combinational AND logic circuit.

FIG. 7 illustrates a block diagram of a logical AND tree 700 that can be implemented in combination logic circuit 150 to facilitate $V_{IH}$ testing. Logical AND tree 700 may include multiple logical AND circuits such as logical AND circuits 752 and 754 that are driven by different groups of input signals. The input signals can be grouped, for example, by functionality, signaling interface type, physical location on the chip, and/or other criteria. Each logical AND circuit can generate its own test signal to allow the input signal groups to be tested separately. For example, logical AND circuit 752 can generate a TEST_1A signal, and logical AND circuit 754 can separately generate a TEST_1B signal. To provide testing flexibility, the logical AND circuits can also be cascaded such that the outputs of the logical AND circuits are combined into one test signal. For example, TEST_1A and TEST_1B can be logically combined by AND gate 756 to generate a global TEST_1 signal. Thus, all input signals can be tested collectively by monitoring TEST_1. When separate testing is desired, TEST_1A and TEST_1B can be monitored. The test signals can be outputted to separate output pins or be multiplexed out on a single output pin. Although only two logical AND circuits 752 and 754, and logical AND tree 700 is shown with only two cascading stages, it should be understood that any number of logical AND circuits and any number of cascading stages can be implemented.

In addition to performing voltage characterization tests on a chip, the techniques described above can also be used to speed up voltage screening tests during mass production. For example, during $V_{IH}$ screening test to verify that the integrated circuit device is operable, an input voltage level of $V_{IH}$ is applied to the receivers in the set of external interface buffer circuits. A logic high level at the output of the logical AND circuit indicates that the integrated circuit device is operating correctly at the $V_{IH}$ voltage level. During $V_{IL}$ screening test, an input voltage level of $V_{IL}$ is applied to the receivers of the set of external interface buffer circuits. A logic low level at the output of the logical OR circuit indicates that the integrated circuit device is operating correctly at the $V_{IL}$ voltage level. During $V_{OH}$ screening test, a logic one is concurrently driven into the drivers of the external interface buffer circuits, and the output voltages are measured and verified to be at least $V_{OH}$. During $V_{OL}$ screening test, a logic zero is concurrently driven into the drivers of the external interface buffer circuits, and the output voltages are measured and verified to be no greater than $V_{OL}$. In each of these screening tests, the test time can be significantly reduced by eliminating the test clock cycles needed to shift in a test pattern on the boundary scan chain, or to shift out the captured logic levels from the boundary scan chain. Additional advantages may include higher test accuracy by allowing the use of PPMU and simplified testing procedures.

Figure 8:
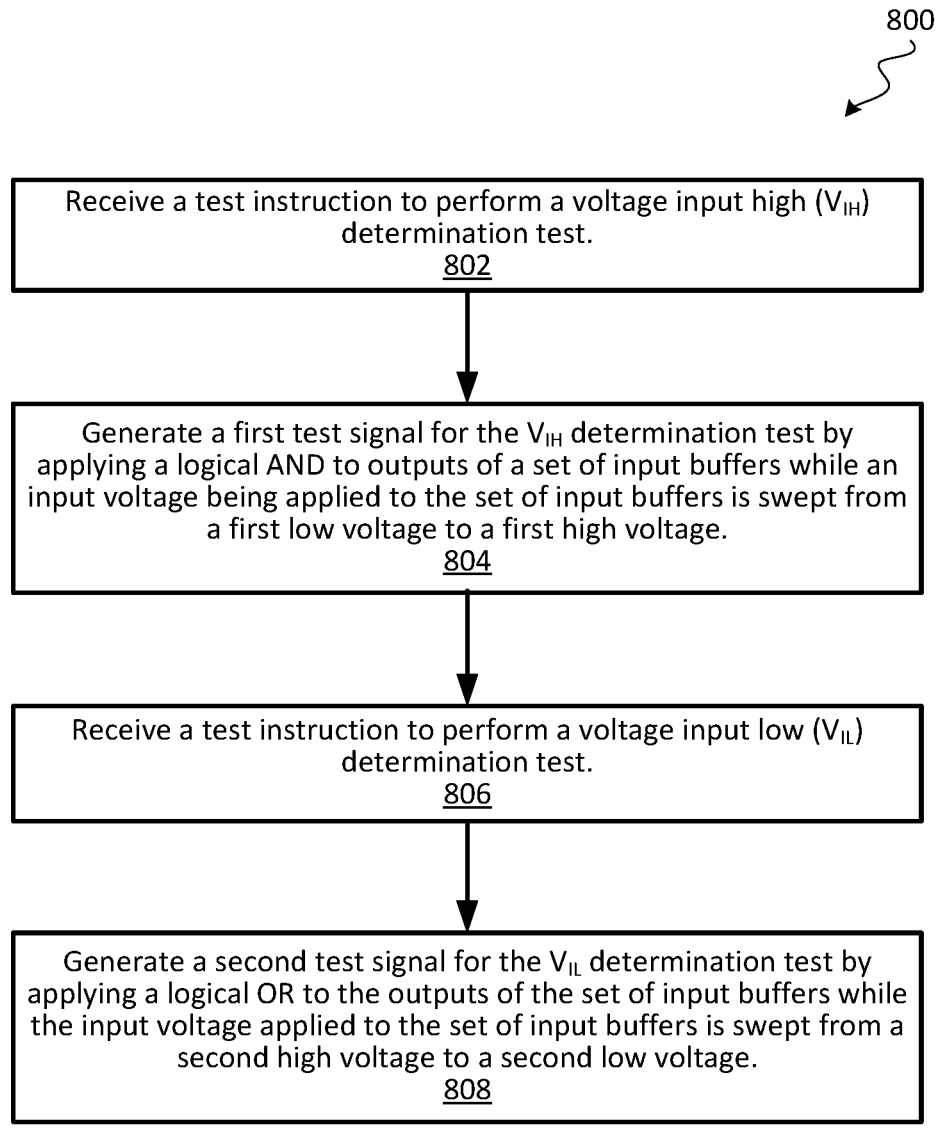
FIG. 8 illustrates an example of a flow diagram for input voltage determination testing.

FIG. 8 illustrates a flow diagram of an example of a process 800 for testing an integrated circuit device. Process 800 can be performed by an integrated circuit device having core circuitry coupled to a set of external interface buffer circuits (e.g., an I/O circuit having a driver/output buffer and a receiver/input buffer). The integrated circuit device may include a combinational logic circuit (e.g., a logical OR circuit, and/or a logical AND circuit) coupled to the set of external interface buffer circuits. The combinational logic circuit can combine a logic level of the outputs of respective receivers of the external interface buffer circuits into a test signal. The integrated circuit device may also include test circuitry to execute a voltage characterization test on the set of external interface buffer circuits. The voltage characterization test can be selected from a plurality of tests (e.g., $V_{IH}/V_{IL}$ determination test, $V_{IH}/V_{IL}$ hysteresis test, $V_{OH}/V_{OL}$ determination test, etc.) based on a test instruction written to a test instruction register. The voltage characterization test may involve detecting a logic level transition of the test signal.

Process 800 may begin at block 802 by receiving a test instruction to perform $V^{IH}$ determination test. The test instruction to perform $V_{IH}$ determination test can be implemented as a JTAG test instruction, and can be written into a JTAG test instruction register. In other implementations, the test instruction to perform $V_{IH}$ determination test can be another form of test instruction implemented independently from JTAG. The test instruction to perform $V_{IH}$ determination test can also be received in the form of an input signal or a combination of input signals.

In response to the test instruction to perform $V_{IH}$ determination test, a test signal for the $V_{IH}$ determination test can be generated at block 804 by applying a logical AND to the outputs of the set of input buffers while an input voltage being applied to the set of input buffers is swept from a first low voltage towards a first high voltage. The first low voltage can be VSS or GND, and the first high voltage can be VDD. The voltage sweep can also start at an intermediate voltage that is higher than VSS or GND to reduce test time. The $V_{IH}$ of the integrated circuit device can be determined when the first test signal transitions from logic zero to logic one.

At block 806, a test instruction to perform $V_{IL}$ determination test can be received. The test instruction to perform $V_{IL}$ determination test can be implemented as a JTAG test instruction, and can be written into a JTAG test instruction register. In other implementations, the test instruction to perform $V_{IL}$ determination test can be another form of test instruction implemented independently from JTAG. The test instruction to perform $V_{IL}$ determination test can also be received in the form of an input signal or a combination of input signals.

In response to the test instruction to perform $V_{IL}$ determination test, a second test signal for the $V_{IH}$ determination test can be generated at block 808 by applying a logical OR to the outputs of the set of input buffers while an input voltage being applied to the set of input buffers is swept from a second high voltage towards a second low voltage. The second high voltage can VDD, and the second low voltage can be VSS or GND. The voltage sweep can also start at an intermediate voltage that is lower than VDD to reduce test time. The $V_{IL}$ of the integrated circuit device can be determined when the second test signal transitions from logic one to logic zero It should be noted that the first high voltage and the second high voltage need not be the same, and that the first low voltage and the second low voltage need not be the same. In some implementations, the first test signal and the second test signal can be selectively coupled to an output pad based on the test instruction. For example, the output pad can be a TDO pad, and the first test signal can be provided on the TDO pad during the $V_{IH}$ determination test, while the second test signal can be provided on the TDO pad during the $V_{IL}$ determination test.

Figure 9:
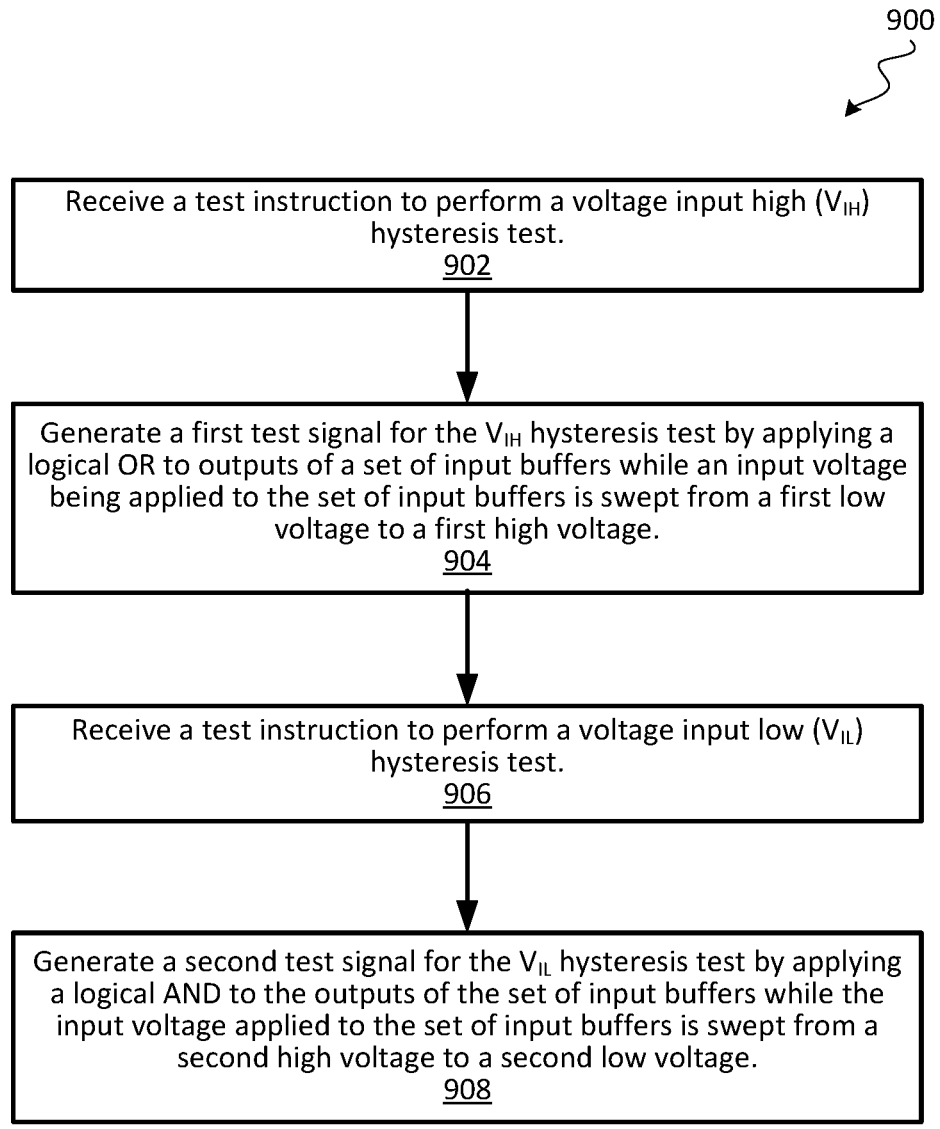
FIG. 9 illustrates an example of a flow diagram for input voltage hysteresis testing.

FIG. 9 illustrates a flow diagram of another example of a process 900 for testing an integrated circuit device. Process 900 can be performed by an integrated circuit device similar to that of process 800.

Process 900 may begin at block 902 by receiving a test instruction to perform $V_{IH}$ hysteresis test. The test instruction to perform $V_{IH}$ hysteresis test can be implemented as a JTAG test instruction, and can be written into a JTAG test instruction register. In other implementations, the test instruction to perform $V_{IH}$ hysteresis test can be another form of test instruction implemented independently from JTAG. The test instruction to perform $V_{IH}$ hysteresis test can also be received in the form of an input signal or a combination of input signals.

In response to the test instruction to perform $V_{IH}$ hysteresis test, a test signal for the $V_{IH}$ hysteresis test can be generated at block 904 by applying a logical OR to the outputs of the set of input buffers while an input voltage being applied to the set of input buffers is swept from a first low voltage towards a first high voltage. The first low voltage can be VSS or GND, and the first high voltage can be VDD. The voltage sweep can also start at an intermediate voltage that is higher than VSS or GND to reduce test time. The upper bound hysteresis voltage of the integrated circuit device is determined when the test signal transitions from logic zero to logic one. This upper bound hysteresis voltage indicates the input voltage when at least one input buffer transitions from a logic zero to a logic one as the input voltage is swept from the first low voltage towards the first high voltage.

At block 906, a test instruction to perform $V_{IL}$ hysteresis test can be received. The test instruction to perform $V_{IL}$ hysteresis test can be implemented as a JTAG test instruction, and can be written into a JTAG test instruction register. In other implementations, the test instruction to perform $V_{IL}$ hysteresis test can be another form of test instruction implemented independently from JTAG. The test instruction to perform $V_{IL}$ hysteresis test can also be received in the form of an input signal or a combination of input signals.

In response to the test instruction to perform $V_{IL}$ hysteresis test, a second test signal for the $V_{IL}$ hysteresis test can be generated at block 908 by applying a logical AND to the outputs of the set of input buffers while an input voltage being applied to the set of input buffers is swept from a second high voltage towards a second low voltage. The second high voltage can be VDD, and the second low voltage can be VSS or GND. The voltage sweep can also start at an intermediate voltage that is lower than VDD to reduce test time. The lower bound hysteresis voltage of the integrated circuit device is determined when the test signal transitions from logic one to logic zero. This lower bound hysteresis voltage indicates the input voltage when at least one input buffer transitions from a logic one to a logic zero as the input voltage is swept from the second high voltage towards the second low voltage.

It should be noted that the first high voltage and the second high voltage need not be the same, and that the first low voltage and the second low voltage need not be the same. In some implementations, the first test signal and the second test signal can be selectively coupled to an output pad based on the test instruction. For example, the output pad can be a TDO pad, and the first test signal can be provided on the TDO pad during the $V_{IH}$ hysteresis test, while the second test signal can be provided on the TDO pad during the $V_{IL}$, hysteresis test.

Figure 10:
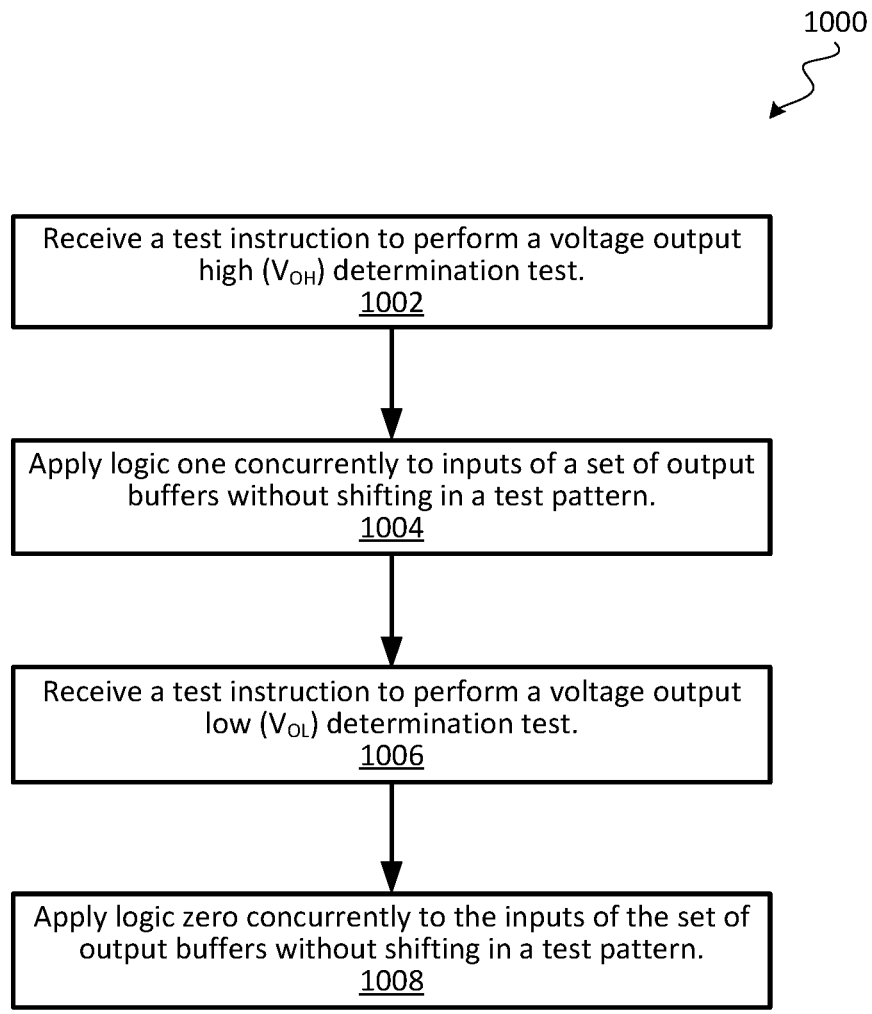
FIG. 10 illustrates an example of a flow diagram for output voltage determination testing.

FIG. 10 illustrates a flow diagram of another example of a process 1000 for testing an integrated circuit device. Process 1000 can be performed by an integrated circuit device similar to that of process 800.

Process 1000 may begin at block 1002 by receiving a test instruction to perform $V_{OH}$ determination test. The test instruction to perform $V_{OH}$ determination test can be implemented as a JTAG test instruction, and can be written into a JTAG test instruction register. In other implementations, the test instruction to perform $V_{OH}$ determination test can be another form of test instruction implemented independently from JTAG. The test instruction to perform $V_{OH}$ determination test can also be received in the form of an input signal or a combination of input signals.

In response to the test instruction to perform $V_{OH}$ determination test, at block 1004, a logic one is concurrently applied to the inputs of a set of output buffers. The logic one can be applied at the boundary scan cell or at the external interface buffer circuit. The logic one can be driven internally or from an external input. The respective voltages at the outputs of the output buffers can be measured, and the lowest voltage can be determined as the $V_{OH}$ for the set of output buffers.

At block 1006, a test instruction to perform $V_{OL}$ determination test can be received. The test instruction to perform $V_{OL}$ determination test can be implemented as a JTAG test instruction, and can be written into a JTAG test instruction register. In other implementations, the test instruction to perform $V_{OL}$ determination test can be another form of test instruction implemented independently from JTAG. The test instruction to perform $V_{OL}$ determination test can also be received in the form of an input signal or a combination of input signals.

In response to the test instruction to perform $V_{OL}$ determination test, a logic zero is concurrently applied to the inputs of a set of output buffers. The logic zero can be applied at the boundary scan cell or at the external interface buffer circuit. The logic zero can be driven internally or from an external input. The respective voltages at the outputs of the output buffers can be measured, and the highest voltage can be determined as the $V_{OL}$ for the set of output buffers.

Each of the voltage tests described above can be performed without requiring to shift a test pattern into the boundary scan chain, and without requiring to shift captured values out of the boundary scan chain. As such, these voltage tests can bypass the shifting operation of the boundary scan chain. This can result in a significant reduction in testing time and simplifies the testing procedure. Bypass the shifting operation of the boundary scan chain can also allow higher precision tester components such as PPMU to be used.

Figure 11:
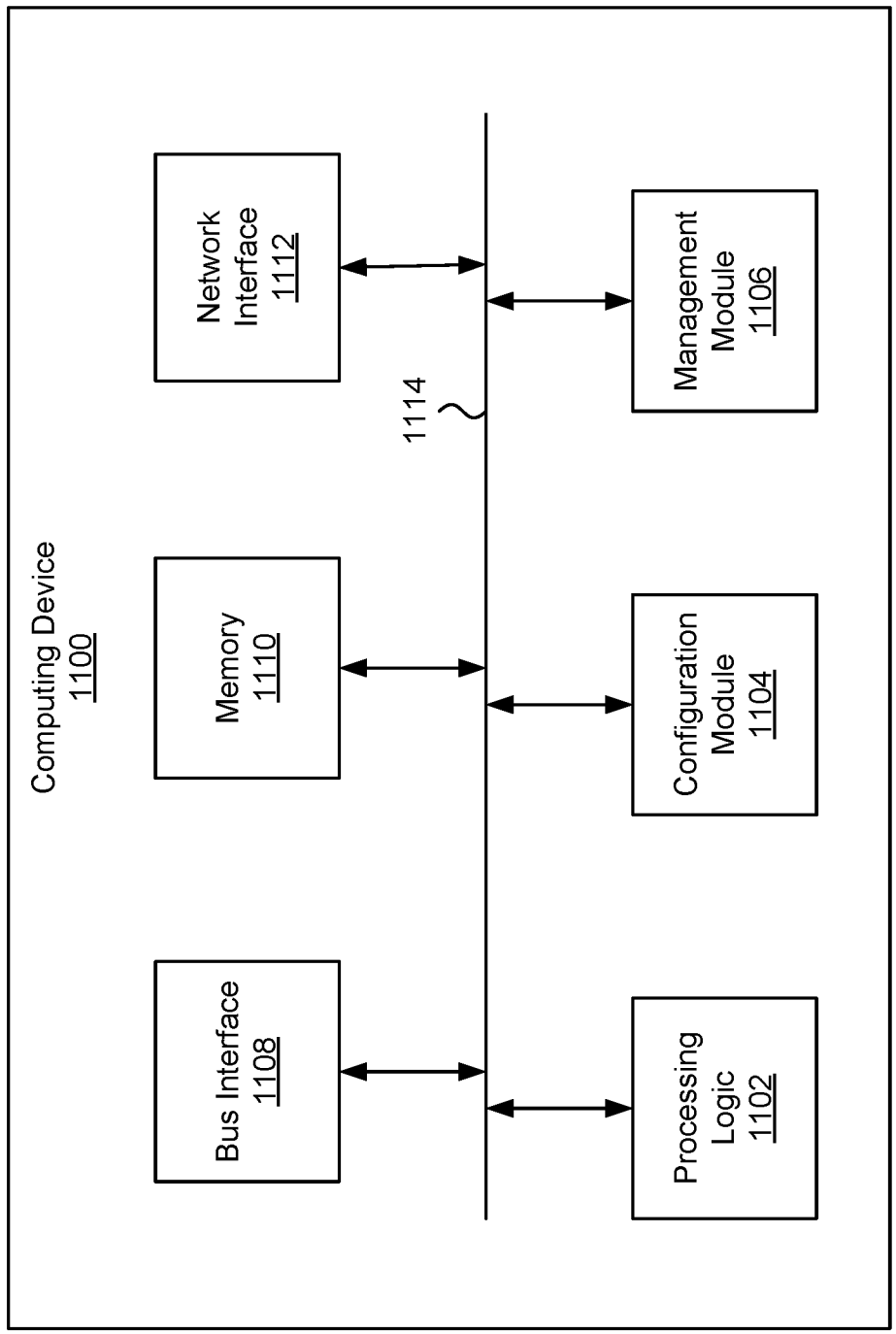
FIG. 11 illustrates an example of a computing device, according to certain aspects of the disclosure.

FIG. 11 illustrates an example of a computing device 1100. Functionality and/or several components of the computing device 1100 may be used without limitation with other embodiments disclosed elsewhere in this disclosure, without limitations. One or more components of computing device can be tested using the techniques described above. A computing device 1100 may facilitate processing of packets and/or forwarding of packets from the computing device 1100 to another device. As referred to herein, a "packet" or "network packet" may refer to a variable or fixed unit of data. In some instances, a packet may include a packet header and a packet payload. The packet header may include information associated with the packet, such as the source, destination, quality of service parameters, length, protocol, routing labels, error correction information, etc. In certain implementations, one packet header may indicate information associated with a series of packets, such as a burst transaction. In some implementations, the computing device 1100 may be the recipient and/or generator of packets. In some implementations, the computing device 1100 may modify the contents of the packet before forwarding the packet to another device. The computing device 1100 may be a peripheral device coupled to another computer device, a switch, a router or any other suitable device enabled for receiving and forwarding packets.

In one example, the computing device 1100 may include processing logic 1102, a configuration module 1104, a management module 1106, a bus interface module 1108, memory 1110, and a network interface module 1112. These modules may be hardware modules, software modules, or a combination of hardware and software. In certain instances, modules may be interchangeably used with components or engines, without deviating from the scope of the disclosure. The computing device 1100 may include additional modules not illustrated here. In some implementations, the computing device 1100 may include fewer modules. In some implementations, one or more of the modules may be combined into one module. One or more of the modules may be in communication with each other over a communication channel 1114. The communication channel 1114 may include one or more busses, meshes, matrices, fabrics, a combination of these communication channels, or some other suitable communication channel.

The processing logic 1102 may include application specific integrated circuits (ASICs), field programmable gate arrays (FPGAs), systems-on-chip (SoCs), network processing units (NPUs), processors configured to execute instructions or any other circuitry configured to perform logical arithmetic and floating point operations. Examples of processors that may be included in the processing logic 1102 may include processors developed by ARM®, MIPS®, AMD®, Qualcomm®, and the like. In certain implementations, processors may include multiple processing cores, wherein each processing core may be configured to execute instructions independently of the other processing cores. Furthermore, in certain implementations, each processor or processing core may implement multiple processing threads executing instructions on the same processor or processing core, while maintaining logical separation between the multiple processing threads. Such processing threads executing on the processor or processing core may be exposed to software as separate logical processors or processing cores. In some implementations, multiple processors, processing cores or processing threads executing on the same core may share certain resources, such as for example busses, level 1 (L1) caches, and/or level 2 (L2) caches. The instructions executed by the processing logic 1102 may be stored on a computer-readable storage medium, for example, in the form of a computer program. The computer-readable storage medium may be non-transitory. In some cases, the computer-readable medium may be part of the memory 1110.

The memory 1110 may include either volatile or non-volatile, or both volatile and non-volatile types of memory. The memory 1110 may, for example, include random access memory (RAM), read only memory (ROM), Electrically Erasable Programmable Read-Only Memory (EEPROM), flash memory, and/or some other suitable storage media. In some cases, some or all of the memory 1110 may be internal to the computing device 1100, while in other cases some or all of the memory may be external to the computing device 1100. The memory 1110 may store an operating system comprising executable instructions that, when executed by the processing logic 1102, provides the execution environment for executing instructions providing networking functionality for the computing device 1100. The memory may also store and maintain several data structures and routing tables for facilitating the functionality of the computing device 1100.

In some implementations, the configuration module 1104 may include one or more configuration registers. Configuration registers may control the operations of the computing device 1100. In some implementations, one or more bits in the configuration register can represent certain capabilities of the computing device 1100. Configuration registers may be programmed by instructions executing in the processing logic 1102, and/or by an external entity, such as a host device, an operating system executing on a host device, and/or a remote device. The configuration module 1104 may further include hardware and/or software that control the operations of the computing device 1100.

In some implementations, the management module 1106 may be configured to manage different components of the computing device 1100. In some cases, the management module 1106 may configure one or more bits in one or more configuration registers at power up, to enable or disable certain capabilities of the computing device 1100. In certain implementations, the management module 1106 may use processing resources from the processing logic 1102. In other implementations, the management module 1106 may have processing logic similar to the processing logic 1102, but segmented away or implemented on a different power plane than the processing logic 1102.

The bus interface module 1108 may enable communication with external entities, such as a host device and/or other components in a computing system, over an external communication medium. The bus interface module 1108 may include a physical interface for connecting to a cable, socket, port, or other connection to the external communication medium. The bus interface module 1108 may further include hardware and/or software to manage incoming and outgoing transactions. The bus interface module 1108 may implement a local bus protocol, such as Peripheral Component Interconnect (PCI) based protocols, Non-Volatile Memory Express (NVMe), Advanced Host Controller Interface (AHCI), Small Computer System Interface (SCSI), Serial Attached SCSI (SAS), Serial AT Attachment (SATA), Parallel ATA (PATA), some other standard bus protocol, or a proprietary bus protocol. The bus interface module 1108 may include the physical layer for any of these bus protocols, including a connector, power management, and error handling, among other things. In some implementations, the computing device 1100 may include multiple bus interface modules for communicating with multiple external entities. These multiple bus interface modules may implement the same local bus protocol, different local bus protocols, or a combination of the same and different bus protocols.

The network interface module 1112 may include hardware and/or software for communicating with a network. This network interface module 1112 may, for example, include physical connectors or physical ports for wired connection to a network, and/or antennas for wireless communication to a network. The network interface module 1112 may further include hardware and/or software configured to implement a network protocol stack. The network interface module 1112 may communicate with the network using a network protocol, such as for example TCP/IP, Infiniband, RoCE, Institute of Electrical and Electronics Engineers (IEEE) 802.11 wireless protocols, User Datagram Protocol (UDP), Asynchronous Transfer Mode (ATM), token ring, frame relay, High Level Data Link Control (HDLC), Fiber Distributed Data Interface (FDDI), and/or Point-to-Point Protocol (PPP), among others. In some implementations, the computing device 1100 may include multiple network interface modules, each configured to communicate with a different network. For example, in these implementations, the computing device 1100 may include a network interface module for communicating with a wired Ethernet network, a wireless 802.11 network, a cellular network, an Infiniband network, etc.

The various components and modules of the computing device 1100, described above, may be implemented as discrete components, as a System on a Chip (SoC), as an ASIC, as an NPU, as an FPGA, or any combination thereof. In some embodiments, the SoC or other component may be communicatively coupled to another computing system to provide various services such as traffic monitoring, traffic shaping, computing, etc. In some embodiments of the technology, the SoC or other component may include multiple subsystems.

The modules described herein may be software modules, hardware modules or a suitable combination thereof. If the modules are software modules, the modules can be embodied on a non-transitory computer readable medium and processed by a processor in any of the computer systems described herein. It should be noted that the described processes and architectures can be performed either in real-time or in an asynchronous mode prior to any user interaction. The functions described herein can be provided by one or more modules that exist as separate modules and/or module functions described herein can be spread over multiple modules.

The specification and drawings are, accordingly, to be regarded in an illustrative rather than a restrictive sense. It will, however, be evident that various modifications and changes may be made thereunto without departing from the broader spirit and scope of the disclosure as set forth in the claims.

Other variations are within the spirit of the present disclosure. Thus, while the disclosed techniques are susceptible to various modifications and alternative constructions, certain illustrated embodiments thereof are shown in the drawings and have been described above in detail. It should be understood, however, that there is no intention to limit the disclosure to the specific form or forms disclosed, but on the contrary, the intention is to cover all modifications, alternative constructions, and equivalents falling within the spirit and scope of the disclosure, as defined in the appended claims.

The use of the terms "a" and "an" and "the" and similar referents in the context of describing the disclosed embodiments (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening. Recitation of ranges of values herein are merely intended to serve as a shorthand method of referring individually to each separate value falling within the range, unless otherwise indicated herein and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate embodiments of the disclosure and does not pose a limitation on the scope of the disclosure unless otherwise claimed. No language in the specification should be construed as indicating any non-claimed element as essential to the practice of the disclosure.

Disjunctive language such as the phrase "at least one of X, Y, or Z," unless specifically stated otherwise, is intended to be understood within the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

Various embodiments of this disclosure are described herein, including the best mode known to the inventors for carrying out the disclosure. Variations of those embodiments may become apparent to those of ordinary skill in the art upon reading the foregoing description. The inventors expect skilled artisans to employ such variations as appropriate and the inventors intend for the disclosure to be practiced otherwise than as specifically described herein. Accordingly, this disclosure includes all modifications and equivalents of the subject matter recited in the claims appended hereto as permitted by applicable law. Moreover, any combination of the above-described elements in all possible variations thereof is encompassed by the disclosure unless otherwise indicated herein or otherwise clearly contradicted by context.

What is claimed is:

1. An integrated circuit device having circuitry to improve voltage characterization testing, the integrated circuit device comprising:
   core circuitry;
   a set of input/output (I/O) circuits coupled to core circuitry, each of the I/O circuits including a driver and a receiver;
   an OR circuit coupled to the set of I/O circuits, the OR circuit configured to generate a logical OR signal from outputs of respective receivers of the I/O circuits;
   an AND circuit coupled to the set of I/O circuits, the AND circuit configured to generate a logical AND signal from the outputs of the respective receivers of the I/O circuits; and
   a test circuit configured to execute a voltage characterization test selected from a plurality of voltage characterization tests based on a test instruction written to a test instruction register, wherein the plurality of voltage characterization tests includes:
      a voltage input high ($V_{IH}$) determination test configured to determine a Val for the integrated circuit device by detecting a transition from a logic zero to a logic one at an output of the AND circuit while an input voltage applied to the set of I/O circuits is swept from a low voltage to a high voltage;
      a voltage input low ($V_{IL}$) determination test configured to determine a $V_{IL}$ for the integrated circuit device by detecting a transition from a logic one to a logic zero at an output of the OR circuit while an input voltage applied to the set of I/O circuits is swept from a high voltage to a low voltage;
      a voltage input high ($V_{IH}$) hysteresis test configured to determine an upper bound hysteresis voltage for the integrated circuit device by detecting a transition from a logic zero to a logic one at an output of the OR circuit while an input voltage applied to the set of I/O circuits is swept from a low voltage to a high voltage; and
      a voltage input low ($V_{IL}$) hysteresis test configured to determine a lower bound hysteresis voltage for the integrated circuit device by detecting a transition from a logic one to a logic zero at an output of the AND circuit while an input voltage applied to the set of I/O circuits is swept from a high voltage to a low voltage.

2. The integrated circuit device of claim 1, wherein the plurality of voltage characterization tests further includes:

a voltage output low ($V_{OL}$) determination test configured to determine a $V_{OL}$ for the integrated circuit device by applying a logic zero concurrently to inputs of respective drivers of the I/O circuits without shifting in a test pattern; and a voltage output high ($V_{OH}$) determination test configured to determine a $V_{OH}$ for the integrated circuit device by applying a logic one concurrently to the inputs of the respective drivers of the I/O circuits without shifting in a test pattern.

3. The integrated circuit device of claim 1, wherein the test instruction register is a JTAG (Joint Task Action Group) instruction register implemented for boundary scan test.

4. The integrated circuit device of claim 1, wherein the output of the OR circuit and the output of the AND circuit are selectively coupled to a TDO (test data out) pad based on the test instruction.

5. An integrated circuit device comprising:
core circuitry;
a set of external interface buffer circuits coupled to the core circuitry;
a combinational logic circuit coupled to the set of external interface buffer circuits, wherein the combinational logic circuit has a logical AND circuit configured to combine a logic level of each of the external interface buffer circuits into a first test signal, and a logical OR circuit configured to combine the logic level of each of the external interface buffer circuits into a second test signal; and
a test circuit configured to execute a plurality of voltage tests on the set of external interface buffer circuits, the plurality of voltage tests including a voltage input high ($V_{IH}$) test based on the first test signal and a voltage input low ($V_{IL}$) test based on the second test signal.

6. The integrated circuit device of claim 5, wherein the plurality of voltage tests includes a continuous voltage test that monitors an output of the combinational logic circuit continuously while an input voltage is swept across a voltage range.

7. The integrated circuit device of claim 5, wherein the plurality of voltage tests includes a voltage test is executed based on an instruction stored in a test instruction register.

8. The integrated circuit device of claim 5, wherein the $V_{IL}$ test is a $V_{IL}$ determination test configured to determine a $V_{IL}$ for the set of external interface buffer circuits collectively by detecting a transition from a logic one to a logic zero at an output of the logical OR circuit when an input voltage applied to the set of external interface buffer circuits is swept from a high voltage to a low voltage.

9. The integrated circuit device of claim 5, wherein the $V_{IL}$ test is a $V_{IL}$ determination test configured to determine a $V_{IL}$ for an individual external interface buffer circuit in the set of external interface buffer circuits by detecting a transition from a logic one to a logic zero at an output of the logical OR circuit when an input voltage applied to the individual external interface buffer circuit is swept from a high voltage to a low voltage, while a logic zero is applied to other external interface buffer circuits in the set of external interface buffer circuits.

10. The integrated circuit device of claim 5, wherein the $V_{IL}$ test is a $V_{IL}$ screening test configured to verify that the integrated circuit device is operable by applying $V_{IL}$ to the set of external interface buffer circuits and verifying that an output of the logical OR circuit is at a logic low level.

11. The integrated circuit device of claim 5, wherein an output of the combinational logical circuit is coupled to a test output pad.

12. The integrated circuit device of claim 5, wherein the $V_{IH}$ test is a $V_{IH}$ determination test configured to determine a $V_{IH}$ for the set of external interface buffer circuits collectively by detecting a transition from a logic zero to a logic one at an output of the logical AND circuit when an input voltage applied to the set of external interface buffer circuits is swept from a low voltage to a high voltage.

13. The integrated circuit device of claim 5, wherein the $V_{IH}$ test is a $V_{IH}$ determination test configured to determine a $V_{IH}$ for an individual external interface buffer circuit in the set of external interface buffer circuits by detecting a transition from a logic zero to a logic one at an output of the logical AND circuit when an input voltage applied to the individual external interface buffer circuit is swept from a low voltage to a high voltage, while a logic one is applied to other external interface buffer circuits in the set of external interface buffer circuits.

14. The integrated circuit device of claim 5, wherein the $V_{IH}$ test is a $V_{IH}$ screening test configured to verify that the integrated circuit device is operable by applying $V_{IH}$ to the set of external interface buffer circuits and verifying that an output of the logical AND circuit is at a logic high level.

15. The integrated circuit device of claim 5, wherein the plurality of voltage tests includes a $V_{IL}$ hysteresis test configured to determine a lower bound hysteresis voltage for the set of external interface buffer circuits by detecting a transition from a logic one to a logic zero at an output of the logical AND circuit when an input voltage applied to the set of external interface buffer circuits is swept from a high voltage to a low voltage.

16. The integrated circuit device of claim 5, wherein the plurality of voltage tests includes a $V_{IH}$ hysteresis test configured to determine an upper bound hysteresis voltage for the set of external interface buffer circuits by detecting a transition from a logic zero to a logic one at an output of the logical OR circuit when an input voltage applied to the set of external interface buffer circuits is swept from a low voltage to a high voltage.

17. The integrated circuit device of claim 5, wherein the test circuit is further configured to execute a voltage output low ($V_{OL}$) determination test to determine a $V_{OL}$ by applying a logic zero to the set of external interface buffer circuits without shifting in a test pattern.

18. The integrated circuit device of claim 5, wherein the test circuit is further configured to execute a voltage output high ($V_{OH}$) determination test to determine a $V_{OH}$ by applying a logic one to the set of external interface buffer circuits without shifting in a test pattern.

19. A method for testing an integrated circuit device, the method comprising:
receiving a first test instruction to perform a voltage input high ($V_{IH}$) determination test;
generating a first test signal for the $V_{IH}$ determination test by applying a logical AND to outputs of a set of input buffers while an input voltage being applied to the set of input buffers is swept from a first low voltage to a first high voltage, wherein the $V_{IH}$ of the integrated circuit device is determined when the first test signal transitions from logic zero to logic one;
receiving a second test instruction to perform a voltage input low ($V_{IL}$) determination test; and
generating a second test signal for the $V_{IL}$ determination test by applying a logical OR to the outputs of the set of input buffers while the input voltage applied to the set of input buffers is swept from a second high voltage to a second low voltage, wherein the $V_{IL}$ of the integrated circuit device is determined when the second test signal transitions from logic zero to logic one.

20. The method of claim 19, further comprising:

receiving a third test instruction to perform a voltage input high ($V_{IH}$) hysteresis test;

generating a third test signal for the $V_{IH}$ hysteresis test by applying a logical OR to the outputs of the set of input buffers while an input voltage being applied to the set of input buffers is swept from the first low voltage to the first high voltage, wherein an upper bound hysteresis voltage of the integrated circuit device is determined when the third test signal transitions from logic zero to logic one;

receiving a fourth test instruction to perform a voltage input low ($V_{IL}$) hysteresis test; and generating a fourth test signal for the $V_{IL}$ hysteresis test by applying a logical AND to the outputs of the set of input buffers while the input voltage applied to the set of input buffers is swept from the second high voltage to the second low voltage, wherein a lower bound hysteresis voltage of the integrated circuit device is determined when the fourth test signal transitions from logic one to logic zero.

21. The method of claim 19, further comprising:

receiving a third test instruction to perform a voltage output high ($V_{OH}$) determination test;

applying logic one concurrently to inputs of a set of output buffers without shifting in a test pattern;

receiving a fourth test instruction to perform a voltage output low ($V_{OL}$) determination test; and applying logic zero concurrently to the inputs of the set of output buffers without shifting in a test pattern.

\* \* \* \* \*